US012772613B2

(12) United States Patent
Jo et al.

(10) Patent No.: US 12,772,613 B2
(45) Date of Patent: Oct. 20, 2026

(54) ULTRAVIOLET LIGHT EMITTING DIODE AND ELECTRIC DEVICE PROVIDED WITH SAME

(71) Applicant: RIKEN, Wako (JP)

(72) Inventors: Masafumi Jo, Saitama (JP); Hideki Hirayama, Saitama (JP)

(*) Notice: Subject to any disclaimer, the term of this patent is extended or adjusted under 35 U.S.C. 154(b) by 355 days.

(21) Appl. No.: 18/294,509

(22) PCT Filed: Jul. 13, 2022

(86) PCT No.: PCT/JP2022/027508
§ 371 (c)(1),
(2) Date: Feb. 1, 2024

(87) PCT Pub. No.: WO2023/013374
PCT Pub. Date: Feb. 9, 2023

(65) Prior Publication Data

US 2024/0339562 A1 Oct. 10, 2024

(30) Foreign Application Priority Data

Aug. 3, 2021 (JP) ................................ 2021-127756

(51) Int. Cl.
*H10W 10/17* (2026.01)
*H10H 20/812* (2025.01)
(Continued)

(52) U.S. Cl.
CPC ...... *H10H 20/8162* (2025.01); *H10H 20/812* (2025.01); *H10H 20/825* (2025.01)

(58) Field of Classification Search
CPC ............ H10H 20/8162; H10H 20/812; H10H 20/825; H10H 20/816
(Continued)

(56) References Cited

U.S. PATENT DOCUMENTS 7,811,847 B2 10/2010 Hirayama et al.
8,451,877 B1 5/2013 Crawford et al.
(Continued)

FOREIGN PATENT DOCUMENTS

JP 2009054780 A 3/2009
JP 2018049949 A 3/2018
(Continued)

OTHER PUBLICATIONS

Bao et al., "Performance Improvements for AlGan-Based Deep Ultraviolet Light-Emitting Diodes With the p-Type and Thickened Last Quantum Barrier," *IEEE Photonics Journal* 7(1), Feb. 2, 2015. (11 pages).
(Continued)

*Primary Examiner* — Theresa T Doan
(74) *Attorney, Agent, or Firm* — Seed Intellectual Property Law Group LLP

(57) ABSTRACT

To improve the emission efficiency of ultraviolet light emitting diodes in the Far-UVC wavelength range, the ultraviolet light emitting diode in one embodiment has a semiconductor layer that includes aluminum, gallium and nitrogen. It may also include Indium. In various embodiments, it may include an AlGaN-based crystal or an InAlGaN-based crystal. The relative atomic ratios of aluminum, gallium, nitrogen and indium may vary at different positions in the layer. The diode comprises a light emitting layer, a spacer layer and an electron blocking layer in this order along the electron flow direction. The Al composition ratio in the spacer layer varies along the position in the thickness direction of the layers. The ultraviolet light emitting diode of the embodiment of the present disclosure can be provided with the emitting layer comprising at least one barrier layer and at least two quantum well layers sandwiching the barrier layer.

5 Claims, 13 Drawing Sheets

(51) Int. Cl.
*H10H 20/816* (2025.01)
*H10H 20/825* (2025.01)

(58) Field of Classification Search
USPC .......................................................... 257/103
See application file for complete search history.

(56) References Cited

U.S. PATENT DOCUMENTS

| | | | |
|---|---|---|---|
| 10,622,530 B2 | 4/2020 | Yamamoto et al. | |
| 10,910,519 B2 | 2/2021 | Choi et al. | |
| 2013/0069034 A1* | 3/2013 | Hirayama ............ | H10H 20/811 257/E33.012 |
| 2017/0250308 A1* | 8/2017 | Jo .................... | H10H 20/01335 |
| 2017/0358705 A1 | 12/2017 | Kim | |
| 2018/0083173 A1 | 3/2018 | Yamamoto et al. | |
| 2019/0148584 A1 | 5/2019 | Islam et al. | |
| 2019/0267514 A1 | 8/2019 | Choi et al. | |
| 2021/0074875 A1 | 3/2021 | Li | |

FOREIGN PATENT DOCUMENTS

| | | |
|---|---|---|
| JP | 2019029536 A | 2/2019 |
| JP | 2019530228 A | 10/2019 |
| JP | 2020098908 A | 6/2020 |

OTHER PUBLICATIONS

Chen et al., "Improved the AlGaN-Based Ultraviolet LEDs Performance With Super-Lattice Structure Last Barrier," *IEEE Photonics Journal* 10(4), Aug. 2018. (8 pages).

Cheng et al., "Electron Confinement and Hole Injection Improvement in InGaN/GaN Light-Emitting Diodes With Graded-Composition Last Quantum Barrier and Without Electron Blocking Layer," *Journal of Display Technology* 11(9):753-758, Sep. 2015.

He et al., "Performance enhancement of AlGaN-based 365 nm ultraviolet light-emitting diodes with a band-engineering last quantum barrier," *Optics Letters* 43(3):515-518, Feb. 1, 2018.

He et al., "Marked enhancement in the efficiency of deep ultraviolet light-emitting diodes 5 by using a $Al_xGa_{1-x}N$ carrier reservoir layer," *Applied Physics Express* 12(062013):062013-1-062013-4, May 31, 2019.

Velpula et al., "Improving carrier transport in AlGaN deep-ultraviolet light-emitting diodes using a strip-in-a-barrier structure," *Applied Optics* 59(17):5276-5281, Jun. 10, 2020.

Xia et al., "Advantages of GaN-based LEDs with two-step graded AlGaN last quantum barrier," *Opt Quant Electron* 48(509), Oct. 27, 2016. (9 pages).

Liu, Z. et al. "Polarization-engineered AlGaN last quantum barrier for efficient deep-ultraviolet light-emitting diodes", Semiconductor Science and Technology, 35 (2020) 075021, 6 pages.

Lu, Y. et al. "Tailoring of polarization in electron blocking layer for electron confinement and hole injection in ultraviolet light-emitting diodes", Journal of Applied Physics 115, 113102 (2014), 6 pages.

Wu, J. et al., "Increasing the Carrier Injection Efficiency of GaN-Based Ultraviolet Light-Emitting Diodes by Double AI Composition Gradient Last Quantum Barrier and p-Type Hole Supply Layer", IEEE Photonics Journal an IEEE Photonics Society Publication, vol. 13, No. 2, Apr. 2021, 9 pages.

Gladysiewicz, M. et al. "Emission and material gain spectra of polar compressive strained AlGaN quantum wells grown on virtual AlGaN substrates: Tuning emission wavelength and mixing TE and TM mode of light polarization", Semiconductor Science and Technology, 33 (2018) 075003, 20 pages.

Extended European Search Report for EP Application No. 22852800.6, dated Oct. 24, 2025, 27 pages.

* cited by examiner

ULTRAVIOLET LIGHT EMITTING DIODE AND ELECTRIC DEVICE PROVIDED WITH SAME

BACKGROUND

Technical Field

The present disclosure relates to an ultraviolet light emitting diode and an electric device equipped with same. More particularly, the present disclosure relates to an ultraviolet light emitting diode emitting far ultraviolet rays and an electric device equipped with the same.

Description of the Related Art

Solid-state light emitting devices utilizing nitride semiconductors are widely used in practical applications, for example, as blue light emitting diodes. Solid-state light sources have also been desired for the ultraviolet range, and ultraviolet light emitting diodes (UVLEDs) that utilize materials like those used for blue light emitting diodes have been developed. In the ultraviolet range, a wavelength range of 350 nm or less is called the deep-UV (DUV) range, and a wavelength range of approximately 200 nm to 280 nm is called the UVC wavelength range. A part of this wavelength range, from 260 to 280 nm, is called a sterilization wavelength, and the development of UV LED technology for this wavelength range has been pursued actively. In recent years, a wavelength range from 210 to 230 nm, which is also called "far ultraviolet" (Far-UVC), has attracted particular attention. Since Far-UVC is expected to have sterilization and virus inactivation capabilities while preventing adverse effects on the human body, there is a need for a practical solid-state light source in that wavelength range.

The LEDs in the deep ultraviolet range (DUVLEDs) are generally fabricated using nitride semiconductor AlGaN crystal. In AlGaN, including AlN and GaN, a band gap corresponding to the wavelength range of 210 nm (AlN) to 340 nm (GaN) is generally realized, according to the composition of Al and Ga. Based on the principle alone, it is not impossible to manufacture LEDs that emit ultraviolet rays in the wavelength range of 210 nm to 340 nm.

In GaN/AlGaN/InGaN-based nitride semiconductor light emitting devices, the properties of a layer known as the last quantum barrier (LQB) have been investigated. For example, it has been proposed to employ compositional gradients in LQBs for electron blocking in blue LEDs (Non-Patent Document 1, Non-Patent Document 2). In those suggestions, the effect of the compositional gradient of the LQB on the function of the electron blocking layer (EBL) has been investigated regarding the electron blocking performances and the efficiency of the injection of electrons. Similar attempts have been investigated in ultraviolet LEDs that emit near-UV light in the wavelength of about 360 nm (see Non-Patent Document 3) and have also been theoretically investigated in the DUV range at about 290 nm (see Non-Patent Document 4). The role of the thickness of the LQB in the DUV region has also been investigated (Non-Patent Document 5). In addition, the introduction of a superlattice in the LQB of an LED device emitting at 285 nm (Non-Patent Document 6) and a structure in which a layer with a high barrier is adopted in addition to the EBL in an LED device emitting at 270 nm (Non-Patent Document 7) have been reported.

In light emitting devices using GaN/AlGaN/InGaN-based nitride semiconductors, multiple quantum well structures are employed for increasing the overlap of the electron and hole distributions by way of wave function confinement and for generating a large number of such electron-hole pairs, thereby increasing the internal quantum efficiency.

CITATION LIST

Non-Patent Documents

Non-Patent Document 1: Chang Sheng Xia et al, "Advantages of GaN-based LEDs with two-step graded AlGaN last quantum barrier", Opt Quant Electron (2016) 48:509 DOI: 10.1007/s11082-016-0785-6

Non-Patent Document 2: Liwen Cheng et al, "Electron Confinement and Hole Injection Improvement in InGaN/GaN Light emitting Diodes With Graded-Composition Last Quantum Barrier and Without Electron Blocking Layer", Journal of Display Technology, Vol. 11, No. 9, 2015, DOI: 10.1109/JDT.2015.2437454

Non-Patent Document 3: Longfei He et al, "Performance enhancement of AlGaN-based 365 nm ultraviolet light emitting diodes with a band-engineering last quantum barrier", Optics Letters Vol. 43, No. 3, pp. 515-518 (2018), DOI: 10.1364/OL.43.000515

Non-Patent Document 4: Longfei He et al, "Marked enhancement in the efficiency of deep ultraviolet light emitting diodes by using a $Al_xGa_{1-x}N$ carrier reservoir layer", Applied Physics Express 12, 062013 (2019), DOI: 10.7567/1882-0786/ab22df Non-Patent Document 5: Xianglong Bao et al, "Performance Improvements for AlGaN-Based Deep Ultraviolet Light emitting Diodes With the p-Type and Thickened Last Quantum Barrier", IEEE Photonics Journal, Volume: 7, Issue: 1, 2015; DOI: 10.1109/JPHOT.2014.2387253

Non-Patent Document 6: Qian Chen et al, "Improved the AlGaN-Based Ultraviolet LEDs Performance With Super-Lattice Structure Last Barrier", IEEE Photonics Journal, Volume: 10, Issue: 4, 2018; DOI: 10.1109/JPHOT.2018.2852660

Non-Patent Document 7: Ravi Teja Velpula et al, "Improving carrier transport in AlGaN deep-ultraviolet light emitting diodes using a strip-in-a-barrier structure", Applied Optics, Vol. 59, Issue 17, pp. 5276-5281, 2020; DOI: 10.1364/AO.394149

BRIEF SUMMARY

Technical Problem

The emission efficiency of actual light emitting devices in the UVC wavelength range (200 nm to 280 nm) decreases exponentially as the emission wavelength decreases. Far-UVC (210-230 nm) light emitting diodes (referred to as "Far-UVCLEDs") have only very low external quantum efficiencies of 0.03% or less. In order to improve the emission efficiency in Far-UVCLEDs, which emit light at any wavelength in the Far-UVC region, it is not possible to achieve good results even if technical concepts that have been employed to improve efficiency at longer wavelengths than Far-UVC are employed. One of the essential reasons for this is that there is little room to increase the Al composition ratio in Far-UVCLEDs in view of the high Al composition ratio of AlGaN, which is more than 0.8. For example, AlGaN with an Al composition ratio of about 0.6 to 0.7 has been used for emission wavelengths in the 260 to 280 nm range. In the Far-UVC region, however, the Al composition ratio of AlGaN must be 0.8 or higher. As a result, the difference between the Al composition ratio and the upper limit of 1.0 (i.e., AlN) is small, and methods solely relying on increasing the Al composition ratio are insufficient. More specifically, the method of increasing the Al composition ratio, which has been employed in light emitting diodes at longer wavelengths, is insufficient in its electron blocking function as a means for suppressing serious electron overflow.

Another essential reason for the low emission efficiency in Far-UVCLEDs is that AlGaN with a high Al composition ratio compared to those with a small Al composition ratio significantly modifies the electronic structure. AlGaN changes its properties at higher Al composition ratios drastically with a boundary of about 0.5 Al composition ratio. Specifically, it is known that TM emission is more dominant than TE emission in ultraviolet light emitting diodes with AlGaN Al composition ratios above 0.5. TM emission is more difficult to extract than TE emission. Nevertheless, if the emission wavelength is 240 nm or longer, it is effective to use quantum wells in the emitting layer to increase the ratio of TE emission through the quantum confinement effect. In Far-UVCLEDs, however, the fraction of TE emission cannot be sufficiently increased even if quantum wells are employed.

The present disclosure is aimed at solving at least one of the problems mentioned above. To improve the emission efficiency of Far-UVCLEDs, a new design concept suitable for the material properties of AlGaN with high Al composition is imperative. This disclosure contributes to the development of various applications that employ Far-UVCLEDs as their light sources by providing a new design concept that can also be compatible with the properties of AlGaN at high Al compositions employed in Far-UVCLEDs.

Solution to Problem

On the basis of the intrinsic limitations of AlGaN at high Al compositions and its material properties, the inventors have found that the efficiency of Far-UVCLEDs can be increased by exploiting the precise control of the band structure of electrons (band engineering), thus completing the disclosure of the present application.

As a result of a thorough theoretical investigation on the details of operation of the electron injection, the inventors found that overflow can be suppressed by devising a layer (spacer layer) disposed just before the electron blocking layer in the electron flow, and experimentally confirmed the effect of the spacer layer. That is, in an embodiment of the present disclosure provided is an ultraviolet light emitting diode having an AlGaN-based crystal or an InAlGaN-based crystal, comprising: an emitting layer; a spacer layer; and an electron blocking layer; wherein the emitting layer, the spacer layer, and the electron blocking layer are stacked in this order from upstream to downstream of the electron flow, wherein an Al composition ratio in the spacer layer varies along position of a thickness direction of the layers.

The inventors also expected by theoretical calculation that a thinner barrier layer sandwiched between multiple quantum well layers would actually produce a band structure of electrons favorable for TE emission and confirmed experimentally the increase in emission efficiency. In other words, in one embodiment of the present disclosure, provided is an ultraviolet light emitting diode having an AlGaN-based crystal or an InAlGaN-based crystal, comprising: an emitting layer having at least one barrier layer and at least two quantum well layers sandwiching the barrier layer, wherein the barrier layer is configured as a thinned layer.

Furthermore, in the present disclosure, it is also preferable to employ a composition gradient for the spacer layer and a thin layer for the barrier layer at the same time.

In these ultraviolet light emitting diodes, it is preferred that the composition distribution of the spacer layer is graded such that the Al composition ratio decreases from the emitting layer to the electron blocking layer, and it is also preferred that the composition distribution of the spacer layer is graded such that the Al composition ratio increases from the emitting layer to the electron blocking layer. The composition distribution of the spacer layer is also preferably inclined so that the Al composition ratio increases from the emitting layer to the electron blocking layer. Also preferred in these ultraviolet light emitting diodes are those in which the thickness of the barrier layer is between 0.2 nm and 4 nm, and even more preferred are those in which the thickness of the barrier layer is between 1 nm and 3 nm. The thickness of the barrier layer in these ultraviolet light emitting diodes is preferably a thickness that makes the TE emission stronger than the TM emission in the emitting layer, and it is also preferred that the thickness of the barrier layer is less than the thickness of the quantum well layer. It is preferred that the main wavelength of the UV light emitted by these UV light emitting diodes is between 210 and 230 nm. Furthermore, embodiments in the present disclosure also provide electrical devices provided with the above-mentioned ultraviolet light emitting diodes as a source of ultraviolet light emission.

In this application, ultraviolet rays in the Far-UVC region refer to ultraviolet rays in the wavelength range of approximately 210 to 230 nm. A "principal wavelength of an ultraviolet light emission" is the wavelength that characterizes the emission spectrum of a light emitting diode, which is not necessarily a single wavelength in general, and typically includes the peak wavelength of the single-peak mountain-shaped emission spectrum. However, the fact that a wavelength range is described for a principal wavelength does not mean that the wavelength range described for that principal wavelength should encompass all the emission spectrum. Furthermore, the description in this application may involve technical terms that are adapted or borrowed from the field of electronic devices and physics for visible and ultraviolet light to describe device structures and functions. For this reason, even in the explanation of electromagnetic waves in the ultraviolet range (ultraviolet rays), which are not visible light, the terms "photon" and "luminescence" as well as "optical-" and "photo-" may be used to describe the operation and radiation phenomena of LEDs. The emitting layer includes a quantum well layer and a barrier layer. The quantum well layer is a layer that provides electrons with a conduction band edge potential that serves as a quantum well, and the barrier layer is a layer that provides a relatively high conduction band edge potential in relation to the quantum well layer. The electron blocking layer is a layer with a high conduction band edge potential that is provided for the purpose of preventing electron leakage, and the spacer layer is a layer that is placed between the quantum well layer and the electron blocking layer, which is the most downstream in the electron flow in the emitting layer, with a conduction band edge potential height between them.

Advantageous Effects of Disclosure

The ultraviolet light emitting diodes provided in any of the aspects of the present disclosure allow higher efficiency operation of the light emitting diodes than was previously possible.

DETAILED DESCRIPTION

Figure 1:
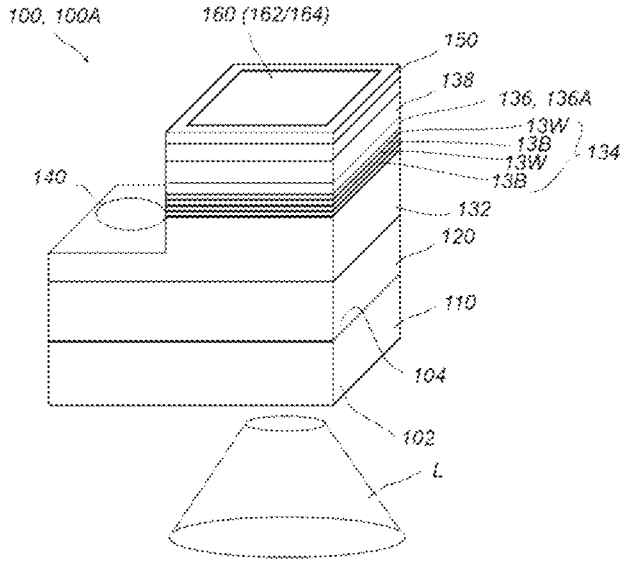
FIG. 1 is a diagram showing the schematic structure common to both a conventional LED and an LED of an embodiment of the present disclosure.

The far-UVC light emitting diode, which may be referred to as far-UVCLED or LED, of the present disclosure are described below. Unless otherwise noted in the description, common parts or elements are marked with a common reference numeral. In addition, each element of each embodiment in the drawing should be understood as not being drawn to scale.

1. First Embodiment

In the LED 100A of this embodiment, the spacer layer 136A with composition gradient is employed to suppress electron overflow. The LED 100A of this embodiment further provides that, in combination with it or independently without it, a barrier layer 13B located between the plurality of quantum well layers 13W is thinned to achieve a band structure in favor of TE light emission. The following describes the structure of an LED that employs both a composition-graded spacer layer 136A and a thinned barrier layer 13B (1-1), then describes the composition-graded spacer layer in detail (1-2), describes the thinned barrier layer in detail (1-3), describes the combination of these layers (1-4), and finally describes a variant (1-5).

1-1. Structure of LEDs

FIG. 1 is a diagram of the schematic structure common to both a conventional LED 100 and an LED 100A of the present embodiment. In the typical configuration of LEDs 100 and 100A, a buffer layer 120 is epitaxially grown by a material such as AlN crystal on one side 104 of a substrate 110, which is a flat $\alpha$-$Al_2O_3$ single crystal (sapphire). From the side of the buffer layer 120, n-type conductive layer 132 is stacked and formed in this order.

In the conventional LED 100, the n-type conductive layer 132 is followed by an emitting layer 134, a spacer layer 136, an electron blocking layer 138, a p-type contact layer 150, and an electrode 160 to act as a second electrode, stacked in this order. The direction of electron flow from upstream to downstream during operation is also identical to this order of stacking. The material of the n-type conductive layer 132 to the spacer layer 136 is typically AlGaN or InAlGaN or any of them with trace elements (Si for n-type, Mg for p-type, etc.) doped as needed. The semiconductor layer can include aluminum, gallium and nitrogen. It can also include indium. As explained later herein the aluminum atomic ratio to the whole may vary at different positions in the semiconductor layer. In addition, the ratio of the other elements, gallium, nitrogen, and indium may also vary relative to each other at different positions in the semiconductor layer, as also set forth later herein. The electron blocking layer 138 is a single layer to provide a high barrier to electrons and is made of AlGaN with a higher Al composition ratio or AlN. A first electrode 140 is electrically connected to the n-type conductive layer 132. The electrode 160 establishes an electrical connection with the electron blocking layer 138 through the p-type contact layer 150. The light output L, which is radiation UV, is emitted from the other side, the light extraction side 102, through the substrate 110.

The composition of each layer is described in more detail. The substrate 110 is a growth substrate on which epitaxial growth of the n-type conductive layer 132 to the p-type contact layer 150 can be processed and is selected from any material that satisfies both the requirements of crystal orientation and heat resistance for growth. If the substrate 110 is remained in the final product, the substrate 110 is also required to be transmissive to radiant UV radiation. Typical materials for the substrate 110 are AlN single-crystal substrates, in addition to the aforementioned $\alpha$-$Al_2O_3$ single-crystal (sapphire), and $Ga_2O_3$ substrates for radiation UV of 300 nm or longer wavelengths. For the substrate 110, those with the appropriate crystallographic orientation and off-angle for each material are selected as appropriate. If the substrate 110 is made of a material that is expected to be conductive, such as a $Ga_2O_3$ substrate, the arrangement of the first electrode 140 can be different from FIG. 1 if it can be electrically connected to the n-type conductive layer 132. The buffer layer 120 is formed in a single or multiple layers as necessary in order to satisfy the crystal growth requirement of growing a good quality AlGaN layer (AlN layer) or InAlGaN layer crystal on the substrate 110 for increasing the internal quantum efficiency $\eta_{IQE}$, which is fabricated to a thickness of about 2 μm, for example. For the n-type conductive layer 132 to the spacer layer 136, a typical structure when an AlGaN layer is employed is that the n-type conductive layer 132 is, for example, a layer of $Al_{0.85}Ga_{0.15}N$ doped with Si to produce an n-type, i.e., an $Al_{0.85}Ga_{0.15}N$; Si layer. The emitting layer 134 has a MQW (multiple quantum well) stacking structure, in which the barrier layer 13B and the quantum well layer 13W are alternately stacked, and from the n-type conductive layer 132 side, the barrier layer 13B, the quantum well layer 13W, the barrier layer 13B, . . . the quantum well layer 13W. Therefore, at least two quantum well layers 13W are included in the emitting layer 134, and some barrier layers 13B are sandwiched between at least two quantum well layers 13W. The material of the emitting layer 134 is configured to have a composition of $Al_{0.94}Ga_{0.06}N$ for the barrier layer 13B and $Al_{0.82}Ga_{0.18}N$ for the quantum well layer 13W. The typical number of quantum wells is 3 or so, for example. The spacer layer 136 is an undoped AlGaN layer. A similar structure can be employed when an InAlGaN layer is employed for the UV emitting layer 130.

The p-type contact layer 150 is a p-type AlGaN or p-type InAlGaN doped with Mg in the material of AlGaN or InAlGaN. If the Al composition ratio is appropriately chosen, the p-type contact layer 150 can have high transmittance for radiation UV. The first electrode 140 is a metal electrode with a stacked Ni/Au structure from the substrate side. The Ni is a layer of, e.g., 25 nm thickness inserted between the Au and its underlying semiconductor layer to realize ohmic contact. For the second electrode, a UV reflective film 164 that is highly reflective to radiation UV is employed for the reflective electrode 160. This UV reflective film 164 is, for example, a film made of a material containing Al, Mg, and Rh as main components. To achieve ohmic contact, Ni is inserted on the substrate side for the reflective electrode 160 as well, which is the insert metal layer 162 that is part of the reflective electrode.

The LED 100A in the present embodiment is similar to the conventional LED 100, except for the internal structure of the emitting layer 134 and the specific structure of the spacer layer 136A. In LEDs employing quantum wells in nitride semiconductors, electrons are injected through the conduction band from the n-type conductive layer 132 and holes are injected through the valence band from the p-type contact layer 150 into the quantum confined state of the quantum well layer 13W formed in the emitting layer 134. The electrons and holes recombine through interband transitions in their quantum wells to emit ultraviolet light. Among the mechanisms governing this radiation efficiency, the inventors have focused on two issues for LEDs in the Far-UVC region: first, the overflow of electrons, and second, the polarization state of the emission.

Figure 2:
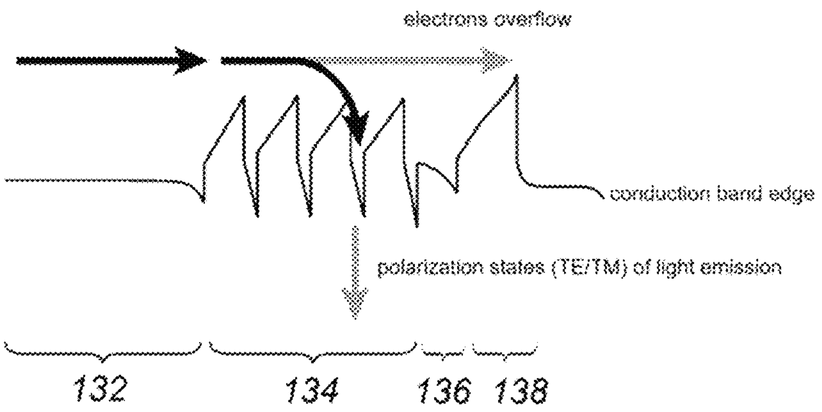
FIG. 2 is an illustration of the problem to be solved in an embodiment of the present disclosure, showing the conduction band edge profiles of the electrons in the n-type layer, emission layer, spacer layer, and electron blocking layer.

FIG. 2 illustrates the problem to be solved in the present embodiment, showing the conduction band edge profiles of electrons in the n-type conductive layer 132, emitting layer 134, spacer layer 136, and electron blocking layer 138, from left to right, with the thickness of the layers oriented in the left-right direction of the drawing. Overflow is a phenomenon in which some of the carriers pass through the emitting layer 134 and current is consumed with no recombination as intended and is a problem for electrons that exhibit high mobility in nitride semiconductor carriers. To suppress electron overflow, nitride semiconductor LEDs generally have a high-barrier layer, called the electron blocking layer 138, at a position downstream of the electron flow as viewed from the emitting layer 134. In the case of Far-UVC LEDs, however, even if the barrier for the electron blocking layer 138 is increased by increasing the Al composition ratio to raise the conduction band edge, the Al composition ratio is increased to the upper limit (100%, i.e., AlN) at most. In this case, the conduction band edge of the electron blocking layer 138 is not high enough in terms of the emitting layer 134, which is made of AlGaN with a high Al composition, and it is difficult to achieve the desired function of blocking electrons. As a result of not being able to sufficiently suppress overflow, even if a Far-UVCLED is fabricated with LED 100 with a conventional structure, the emission efficiency of the LED is degraded due to ineffective current that does not contribute to emission.

The polarization state of the emission is whether the emitted ultraviolet light is transverse magnetic (TM) mode light or transverse electric (TE) mode light. The case where the electric field oscillates in the thickness direction of the emitting layer 134 is called TM mode, and the case where the electric field oscillates in the plane of the emitting layer 134 is called TE mode. In this document, the light in TE mode and the emitting operation that emits such light are also called TE light and TE emission, respectively, and the same applies to TM. The optical transition emitting TM light has a profile that radiates in the in-plane direction of the stacked structure of the quantum well layer 13W, barrier layer 13B, etc. Therefore, as the light propagates inside the LED, which is about the size of a millimeter, it is scattered or absorbed and tends to decay before being emitted externally. In contrast, optical transitions emitting TE light have a profile where the radiation direction is in the thickness direction of the stacked structure. Therefore, TE light can be emitted directly from the LED or, with the help of reflective electrode 160, the direction of propagation is flipped, and the light is emitted. However, when the Al composition ratio is increased above 0.8 for the Far-UVC region in AlGaN, TM emission becomes dominant due to the influence of the band structure, especially the electronic states serving as holes, and the light extraction efficiency is reduced.

1-2. Suppression of Electron Overflow by Composition Gradient Spacer Layer

Figure 3:
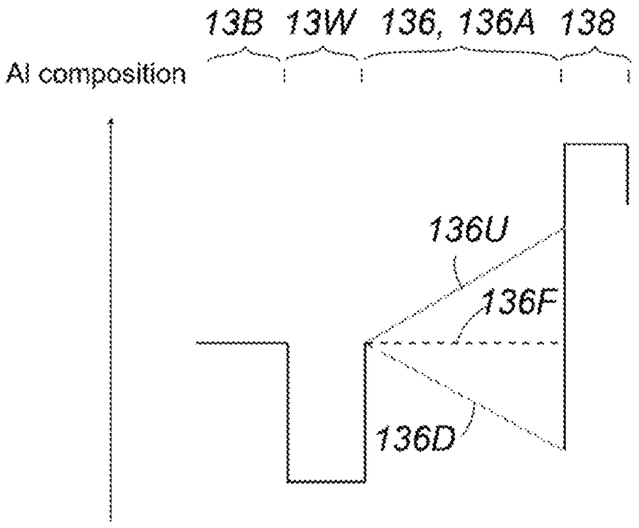
FIG. 3 is a schematic diagram showing a relationship between the position in the thickness direction of the layers and the Al composition ratio (longitudinal direction) in the barrier layer, quantum well layer, spacer layer, and electron blocking layer in the conventional LED and the LED of an embodiment of the present disclosure.

In the LED 100A of present embodiment, the Al composition ratio of the spacer layer 136A is continuously varied according to the position in the thickness direction. This continuous change is referred to as "compositional gradient" in the present embodiment because it is typical for the composition to be graded so that it increases or decreases according to the position. FIG. 3 is a schematic diagram showing the relationship between the Al composition ratio and the position in the thickness direction of the layers in the barrier layer 13B, quantum well layer 13W, spacer layers 136 and 136A, and electron blocking layer 138. The horizontal and vertical directions of the drawing are the positions in the stacking direction and the AlN composition ratio at each position in the LEDs 100 and 100A, respectively. The spacer layers 136 and 136A are sandwiched between the lowest one of the plurality of quantum well layers 13W in the direction of electron flow (rightward in the drawing) and the electron blocking layer 138. The Al composition ratio is small in the quantum well layer 13W and large in the electron blocking layer 138. The spacer layers 136 and 136A are configured to have values between those of the quantum well layer 13W and the electron blocking layer 138. The spacer layer 136 of the conventional LED 100 is fabricated to have a flat (flat) Al composition ratio (chain line 136F in FIG.) distributed over the thickness direction regardless of the position thereof. In contrast, the spacer layer 136A of the LED element 100A in the present embodiment has a slope 136U or a slope 136D that increases or decreases in Al composition ratio depending on the position in the thickness direction from the emitting layer 134 to the electron blocking layer 138. In this application, the structures such that the Al composition ratio has a slope that increases and decreases in the direction from the emitting layer 134 to the electron blocking layer 138 are also referred to as composition increase and composition decrease, respectively. The conduction band edge profile of the spacer layer 136 shown in FIG. 2 may be subject to piezoelectric polarization at the position where the composition changes due to the polarity of the crystal. As a result, the conduction band edge profile of the spacer layer 136 with a flat Al composition ratio is also generally accompanied by tilting and bending.

To confirm the effect of the composition-graded spacer layer 136A, the inventors investigated the efficiency of electron injection through theoretical calculations and then confirmed the experimental results of the actual emitting operation. Theoretical calculations were performed by the simulation software SiLENSe (Semiconductor Technology Research (STR), St. Petersburg, Russia). The calculations were performed by adopting a realistic structure, and the typical conditions are as follows: for both the conventional LED 100 and the present embodiment LED 100A, the quantum well layer 13W has a thickness of 3 nm and an Al composition ratio of 0.82, and its number is 4. The electron blocking layer 138 has a thickness of 9 nm and an Al composition ratio of 1.0 (i.e., AlN). In the flat spacer layer 136 for the conventional LED 100, the Al composition ratio is constant at 0.94. In the composition-graded spacer layer 136A for the LED 100A in the present embodiment, the Al composition ratio is linear from 0.94 to 1.0 depending on the position in the thickness direction from the quantum well layer to the electron block layer. In these calculations, the effects of band tilting and bending due to polarization are reflected when polarized substrates are employed. The effect of electron leakage was evaluated by the results of the calculations of the efficiency of electron injection.

Figure 4A:
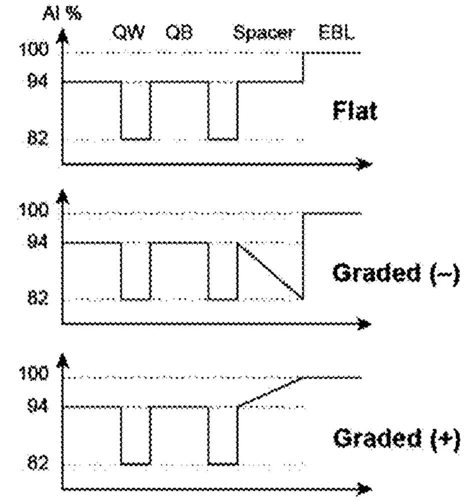
FIGS. 4A, 4B and 4C illustrate the distribution of Al composition ratios in the thickness direction for the structure employed (FIG. 4A), the graph of current-internal quantum efficiency obtained by the calculations (FIG. 4B) and the graph of injection efficiency obtained by changing the composition gradient (FIG. 4C) calculated for the LEDs of an embodiment of the present disclosure.
Figure 4B:
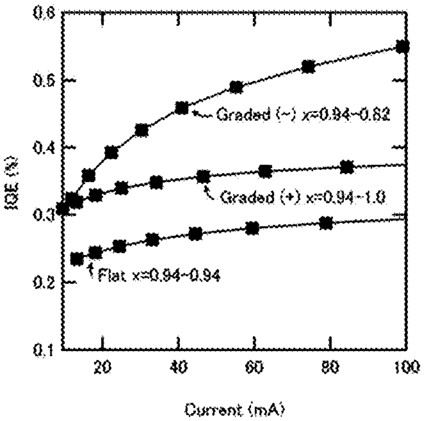
Figure 4C:
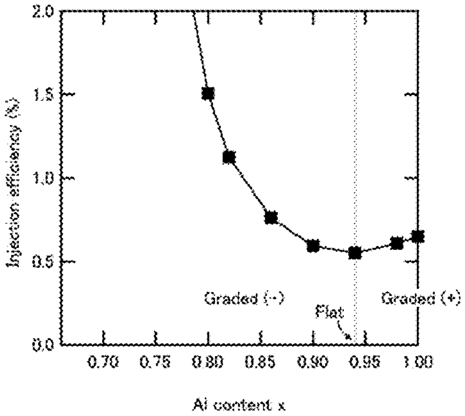

FIGS. 4A-C illustrate the distribution of Al composition ratios in the thickness direction for the structure employed in the calculations for the present embodiment of the LED device (FIG. 4A), the graph of current-internal quantum efficiency obtained by the calculations (FIG. 4B), and of injection efficiency obtained by changing the composition gradient (FIG. 4C). The "Flat (–)," "Graded (–)," and "Graded (+)" in FIGS. 4A and B are assigned to the flat (i.e., spacer layer 136), composition-decreasing configuration in which the Al composition ratio x is decreased from 0.94 to 0.82, and composition-increasing configuration in which x is increased from 0.94 to 1.0, respectively. The Al composition ratio x is a fractional value that is also expressed in $Al_xGa_{1-x}N$ or $(AlN)_x(GaN)_{1-x}$. As shown in FIG. 4B, in both structures, the internal quantum efficiency increases as the current increases. Among them, compared to the flat composition distribution, the composition gradient one has an increased internal quantum efficiency regardless of whether the gradient is increased or decreased. In other words, recombination is performed as designed in the composition-graded spacer layer 136A more than in the flat-composition spacer layer 136. Here, the Al composition ratio of the spacer layer 136A was fixed to 0.94 as before at the position where it contacts the quantum well layer 13W (called "starting Al composition ratio"), and the value at the position where it reaches the electron block layer 138 (called "final Al composition ratio") was x. The efficiency of electron injection with respect to x was calculated. The final Al composition ratio x=0.94 corresponds to the structure of the flat spacer layer 136. As shown in the figures, it was found that the injection efficiency is the smallest in the flat spacer layer 136, and the injection efficiency increases according to the composition gradient, regardless of whether the gradient is increased or decreased.

Based on the common technical knowledge, one could say that compositional decrease and compositional increase in the compositional gradient would have opposite effects on each other. However, the simulation results show a more complicated situation, and multiple mechanisms might be involved. In the inventors' view, there are several physical mechanisms that may work from the structural aspect and contribute to the improved performance, including the following:

(A) The composition gradient substantially increases the electron block height compared to the flat one, thereby suppressing electron overflow.

(B) Compositional gradient produces an effect of decreasing the hole block height compared to the flat one, resulting in an increase in hole injection efficiency.

(C) In the composition gradient, the carriers accumulated at the interface between the spacer layer and the electron blocking layer contribute to light emitting compared to the flat one. This effectively acts as an additional quantum well. This substantial quantum well is called an "interface quantum well (IQW).

In reality, at least one of these physical mechanisms might be in effect, and it is expected that any one or more of them might be in effect at the same time.

Figure 5A:
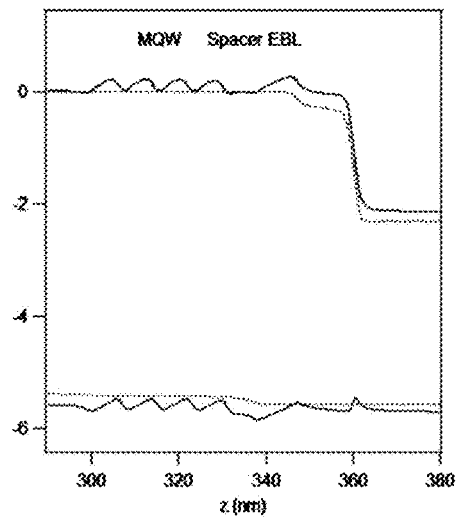
FIGS. 5A, 5B and 5C are example band diagrams to illustrate the calculation to obtain the block height of the LED of an embodiment of the present disclosure. Illustrated are a band diagram in operation (FIG. 5A) and an enlarged band diagram of the portion of the band diagram that gives the block height of the electrons and holes (FIGS. 5B and 5C).
Figure 5B:
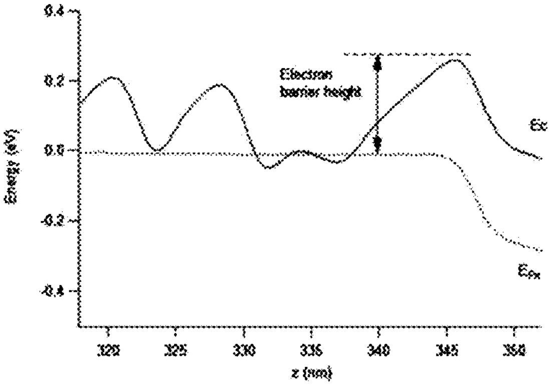
Figure 5C:
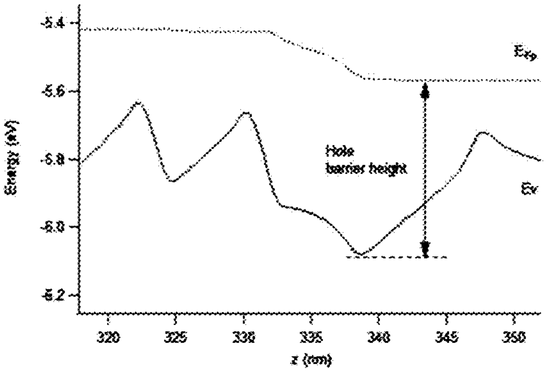
Figure 6A:
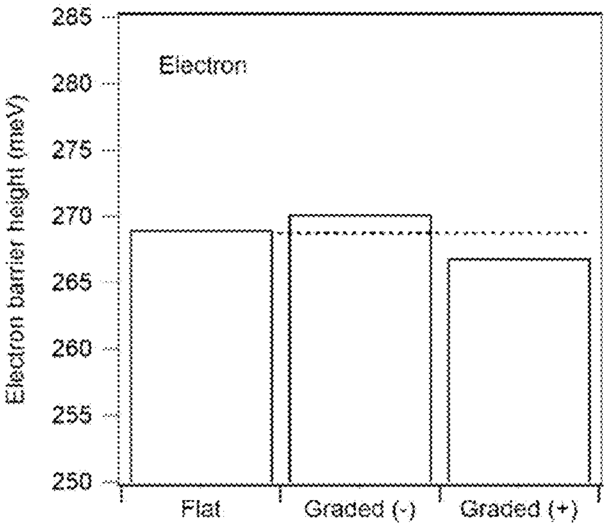
FIGS. 6A and 6B show the calculated block heights for electrons (FIG. 6A) and holes (FIG. 6B) for Far-UVCLEDs. Illustrated are the cases of flat (conventional) and composition reduction (present embodiment) and composition increase (present embodiment).
Figure 6B:
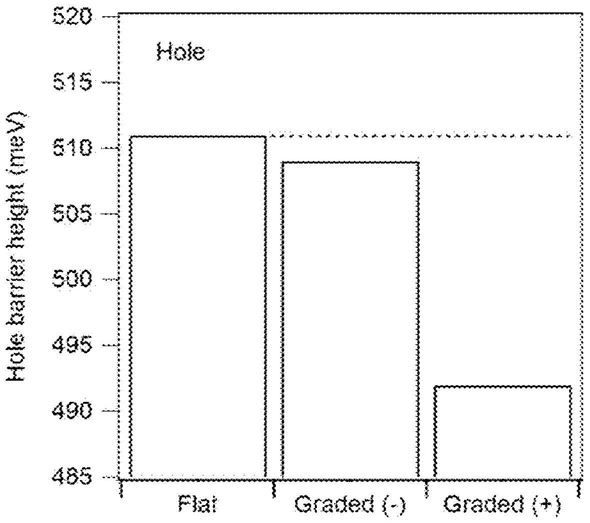

In order to investigate the extent to which any of mechanisms A-C may contribute, the block heights for electrons and holes were calculated from the band diagram at 100 mA operation. FIGS. 5A-C are example band diagrams to illustrate the calculation to obtain the block height of the LED in the present embodiment. Illustrated are the band diagram at 100 mA operation (FIG. 5A), as well as an enlarged band diagram of the area giving the block height of the electrons and holes (FIGS. 5B and 5C). FIGS. 6A-B also show the calculated block heights for electrons (FIG. 6A) and holes (FIG. 6B) for flat, composition-reduced, and composition-increased cases for conventional and Far-UVCLEDs in the present embodiment. The block height is the energy difference between the quasi-Fermi level and the potential maximum of the block layer 138 in eV (or meV). In FIGS. 5A-C, the quasi-Fermi level is shown by a chain line, and the potentials for electrons and holes are shown by solid lines. In FIGS. 5B-C, the quasi-Fermi levels are marked with the signs $E_{Fn}$ (electrons) and $E_{Fp}$ (holes), and the potentials are marked with the signs of the conduction band edge $E_C$ and valence band edge $E_V$, respectively. The energy difference is determined by measuring the peak (electrons) or bottom (holes) of the potential in the range of the location of the block layer 138 (z=340-346 nm) from the quasi-Fermi level.

That is, it is determined as the difference from the quasi-Fermi level $E_{Fn}$ (0.0 eV in the example in FIG. 5B) for electrons flowing from upstream to downstream (left to right) to the maximum value of the potential $E_C$ (0.26 eV). Similarly, the hole is determined as the difference from the quasi-Fermi level $E_{Fp}$ (−5.58 eV) to the minimum potential $E_V$ (−6.08 eV) for a hole flowing from upstream to downstream (right to left on the paper). The absolute value of these differences is the block height for each carrier. For electrons, a large value of the block height is preferred in terms of the function of the electron blocking layer, while a small value is preferred for the injection of electrons, but not for the operation of holes. From FIGS. 6A and 6B, the electron block height increases, and the hole block height decreases as a function of composition decrease compared to the flat composition. In other words, the composition decrease performs increasing efficiency for both electron and hole carriers, ensuring blocking of electrons as intended, and smoothing out the injection of electrons and holes. In contrast, with composition increase, the electron block height decreases, and the hole block height decreases even more. In other words, compared to flat ones, composition increase results in insufficient blocking of electrons, but at the same time the improved injection of electrons improves the efficiency of electrons injection beyond that.

Figure 7:
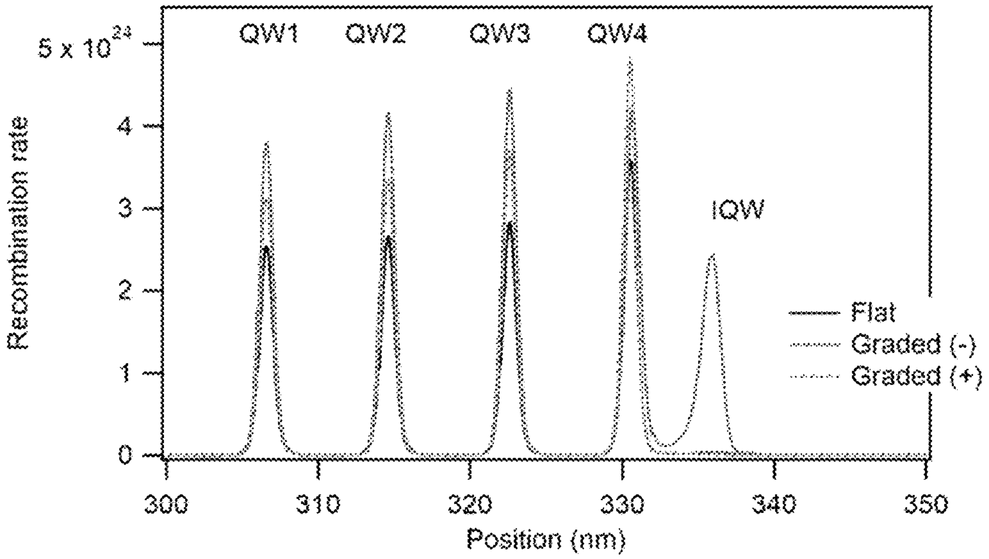
FIG. 7 is a graph of the calculated emission recombination rates at each position in the thickness direction of the LEDs of an embodiment of the present disclosure.

Furthermore, the recombination rate of emission at each well was calculated. FIG. 7 is a graph of the calculated emission recombination rates at each position in the thickness direction of the LED 100A in the present embodiment. The references QW1 to QW4 are identifiers provided to the quantum well layer 13W in stacking order toward the electron blocking layer 138. IQW refers to the interfacial quantum wells that are substantially generated at the interface between the spacer layer 136A and the electron blocking layer 138. The signs "Flat (−)," "Graded (−)," and "Graded (+)" are the same as in FIGS. 4A and B. The Al composition ratio is 0.94 for flat, 0.94 for starting Al composition ratio and 0.82 for final Al composition ratio in the case of compositional decrease, and 0.94 for starting Al composition ratio and 1.0 for final Al composition ratio in the case of compositional increase. Al composition ratio of 1.0. FIG. 7 shows that the emission rate at each well increased from flat for both composition decrease and composition increase. In addition to that, the emission component of the interfacial quantum wells (IQWs) is also larger for composition decrease.

From FIGS. 4A-C, 5A-C, 6A-B, and 7, the composition decrease results in better performance than the flat structure for all of mechanisms A, B, and C. Note that the emission peak wavelength of IQW depends on the final Al composition ratio x in composition decrease. If the final Al composition ratio x falls below 80% and the peak emission wavelength of IQW becomes separated from the wavelength of the other quantum wells, the performance could be unsuitable for LEDs. Whether or not IQWs are incorporated into the emission region and whether the peak emission wavelength of IQWs is appropriate or not depend on the applicable application. The optimum value of the final Al composition ratio x and its range can be determined in terms of whether the IQW emission is required or not as well as the appropriateness of the IQW emission. For example, determining the final Al composition ratio x to realize the peak emission wavelength of the IQW matching the emission wavelength of the emitting layer 134 is a typical example of this optimization. Adjusting the emission peak wavelength of the IQW so that the suppression of adverse effects on the human body, which is one of the characteristics of Far-UVC, for example, is maintained, is another typical example of this optimization.

As described above, theoretical calculations show that the efficiency of electron injection is about 1.7 times higher in the spacer layer 136A with a composition gradient that increases the Al composition ratio and about 2.1 times higher in the spacer layer 136A with a composition gradient that decreases the Al composition ratio, as a relative ratio to the flat spacer layer 136.

Figure 8A:
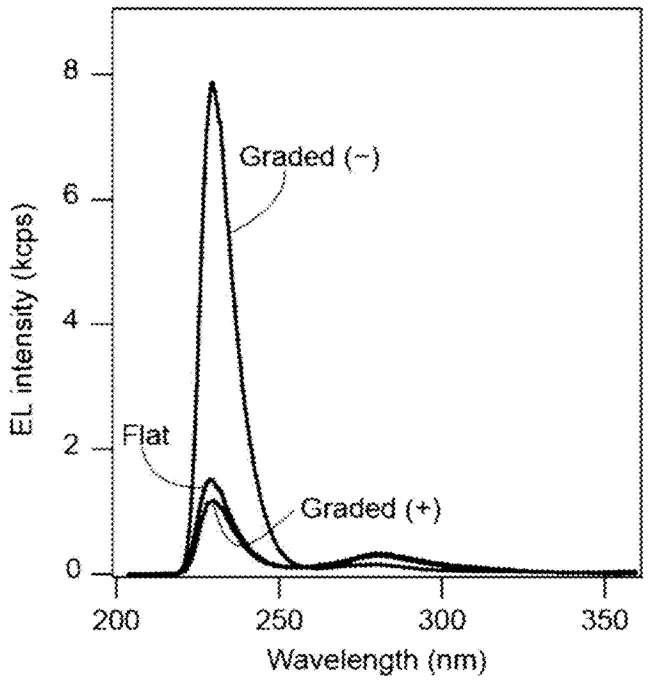
FIGS. 8A and 8B are the measured electroluminescence (EL) spectra (FIG. 8A) and current-light output characteristics (FIG. 8B) in the LED samples of conventional and an embodiment of the present disclosure.
Figure 8B:
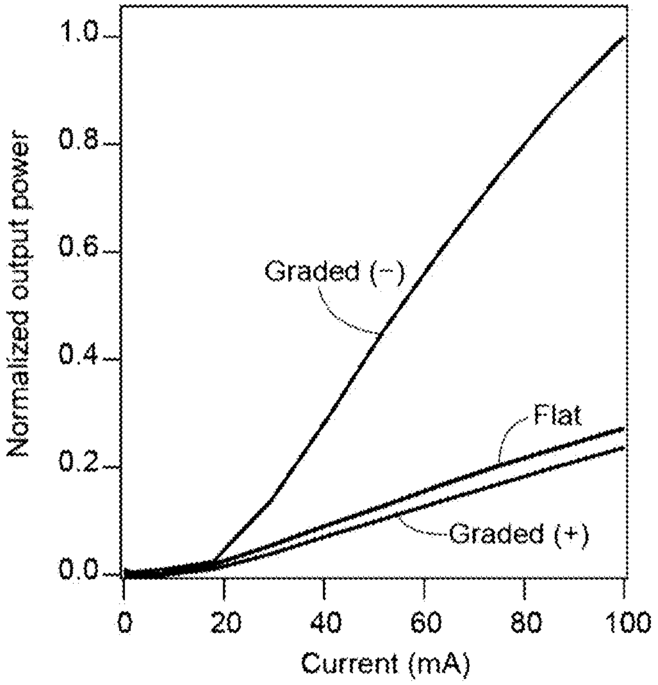

In experiments to confirm the emitting behavior, LED samples were prepared for each one with the spacer layer 136 with a flat composition and with the spacer layer 136A with compositional gradients of increasing and decreasing composition regarding the Al composition ratio, to correspond to the LEDs 100 and 100A in the conventional and present embodiments, then the electroluminescence was measured. The LED samples were fabricated by the metal-organic vapor phase epitaxy (MOVPE) method, in a manner like conventional ultraviolet LEDs made of nitride semiconductors. To form the composition-graded spacer layer 136A, specific conditions for the ratio of TMAl (tri-methyl-aluminum), the raw material gas for Al, and TMGa (tri-methyl-gallium), the raw material gas for Ga, were changed according to whether the spacer layer would have a flat Al composition or a composition-graded spacer layer. The remaining fabrication conditions regarding the structure were identical. The electrode size was set to 0.4 mm square, and constant current operation was employed. FIG. 8A-B are the measured electroluminescence (EL) spectra (FIG. 8A) and current-light output characteristics (FIG. 8B) for the conventional and present embodiment LED samples. As shown in FIG. 8, a significant improvement in output power was observed with composition decrease compared to flat one. On the other hand, the composition increase resulted in a slight reduction in output compared to the flat. The difference from the simulated results is attributable to a wide range of factors, including differences in physical parameters and structure.

Regarding the choice between composition increase and composition decrease, the inventors consider composition decrease to be the more practical structure that is easier to use and has better reproducibility from the viewpoint of tolerance to deviations from the ideal structure that may occur, such as structural and parameter fluctuations, and from the viewpoint of stable output improvement. Furthermore, composition decrease could be advantageous from another viewpoint as well. Referring to the Al composition dependence of the injection efficiency obtained from the simulation (FIG. 4C), it can be understood that a flat Al composition ratio in the spacer layer results in the minimum efficiency, from which the efficiency improvement progresses as the amount of composition change (composition gradient) increases. However, in the case of actual Far-UVCLEDs with a wavelength of 230 nm, it is necessary to use AlGaN, which is close to AlN, for the emitting layer, so the final Al composition ratio reaches a ceiling at 100% even if the composition increase is adopted. On the other hand, since a wide range of final Al composition ratios can be selected by decreasing the composition, there should be more room for improving the efficiency of short wavelength LEDs that use high Al compositions by decreasing the composition.

The inventors have confirmed that the current structure is nearly optimal in the experimental results in terms of changes in the spacer layer thickness and final Al composition ratio. This was confirmed by varying the parameters more exhaustively through the experiments described below.

First, we investigated the dependence of the thickness of the spacer layer 136 (spacer layer thickness) when the composition reduction was employed. As a result, when the thickness of the spacer layer 136 was varied from 3, 6, and 9 nm while the starting Al composition ratio was fixed to 0.94 and the final Al composition ratio to 0.82, the optical output was 0.15 mW, 0.48 mW, and 0.33 mW, respectively.

Next, the dependence of the final Al composition ratio on the attained Al composition ratio was investigated when the starting Al composition ratio was fixed to 0.94. The results showed that when the final Al composition ratio x was varied from 0.78, 0.82, and 0.86, the optical output was 0.20 mW, 0.48 mW, and 0.10 mW, respectively.

Figure 9:
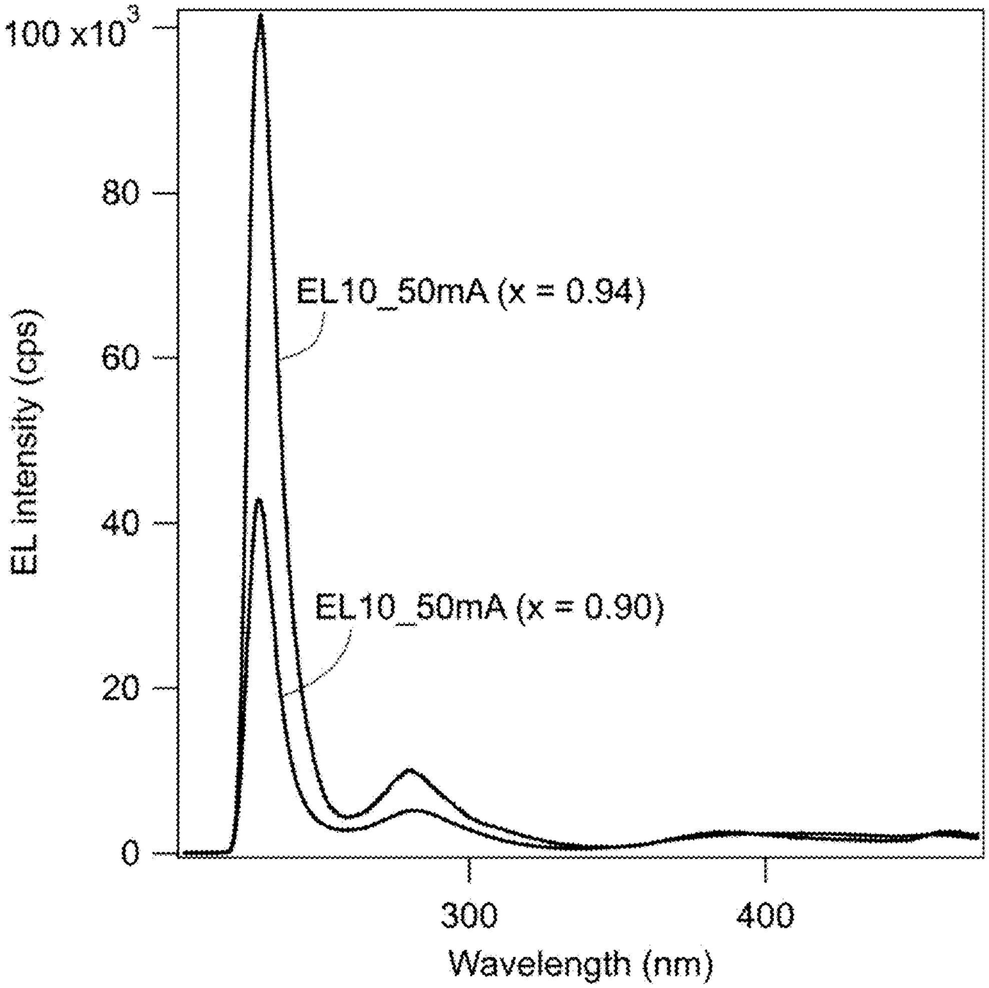
FIG. 9 is the EL spectra obtained from each of the samples with varying starting Al composition ratios in the LEDs of an embodiment of the present disclosure.

Moreover, the dependence of the final Al composition ratio on the starting Al composition ratio was investigated when the final Al composition ratio was fixed to 0.82. The results showed that when the starting Al composition ratio was changed to 0.90 and 0.94, the light output was 0.45 mW and 0.90 mW, respectively. FIG. 9 shows the EL spectra obtained from each of the samples in which the starting Al composition ratio was varied from 0.90 to 0.94 in the present embodiment of the LED.

Thus, it was confirmed that a spacer layer 136A with a spacer layer thickness of 6 nm, a starting Al composition ratio of 0.94, and a final Al composition ratio of 0.82 would have a good performance.

It should be noted that composition-graded LQB layers have also been investigated in the past for LEDs with emitting wavelengths longer than 240 nm (Non-Patent Document 1-7). The composition gradient of the spacer layer has been theoretically investigated, inter alia, in Non-Patent Document 4. However, the disclosures in those references are limited to the improvements at longer wavelengths compared to the Far-UVC (210 nm to 230 nm) in the present application. Since the wavelength range where the limit of the Al composition ratio is not an issue as in the present application, there is no consideration of the limitation caused by the Al composition ratio in the conventional ones. In particular, it should be mentioned that the effect of compositional gradient varies greatly depending on the emission wavelength and material composition to be employed. For example, whether the emission intensity increases in terms of composition increase or composition decrease with respect to the Al composition ratio toward the electron blocking layer cannot be determined without considering the wavelength of the emitting layer. For example, at an emission wavelength of 280 nm, the Al composition ratio of the electron block layer can be widely adjusted because there is sufficient room to increase the Al composition ratio placed in the composition of the electron block layer. For emission wavelengths longer than 240 nm, the contribution of the LQB layer and the spacer layer itself to electron leakage is relatively limited. Therefore, findings at emission wavelengths longer than 240 nm are not applicable to Far-UVC. In fact, in the present embodiment, which typically relates to operation in the 210-230 nm wavelength range, the experimental results in FIG. 8A demonstrate for the first time the effectiveness of compositional gradient at shorter wavelengths, where AlGaN shows significantly modified properties from longer wavelengths. In the conventional structure in which an electron blocking layer is combined with a spacer layer with a flat Al composition ratio in the 210-230 nm wavelength range, even if an AlN electron blocking layer with an Al composition ratio as high as possible is employed, a serious decrease in the efficiency of electron injection due to electron overflow is expected to occur under conditions in which current is applied to drive the device. Thus, in the present embodiment, it is expected that by adjusting the composition distribution of the spacer layer 136A, it is possible to suppress electron leakage under the condition that the current for driving is applied, and this has been confirmed by experiments. The inventors speculate that the principle of this operation may be because the barrier height of the electron blocking layer 138 may increase from the quasi-Fermi level of the electrons, thereby suppressing the overflow of electrons. This enhancement effect of the barrier height of the electron blocking layer 138 with respect to the quasi-Fermi level can occur not only with a composition decreasing slope 136D of the Al composition ratio, but also with a composition increasing slope 136U (both FIG. 3).

1-3. Polarization Control by Thinner Barrier Layer

Figure 10A:
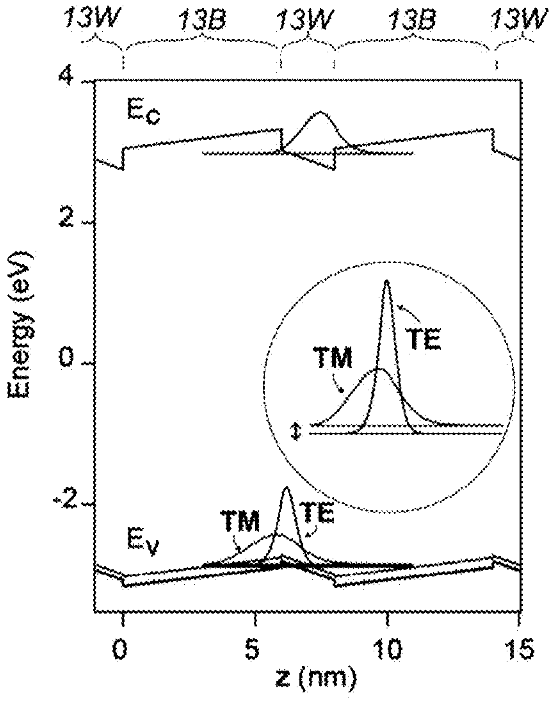
FIGS. 10A and 10B are band diagrams illustrating the polarization of UV emitted in the conventional LED and the LED of an embodiment of the present disclosure, respectively.
Figure 10B:
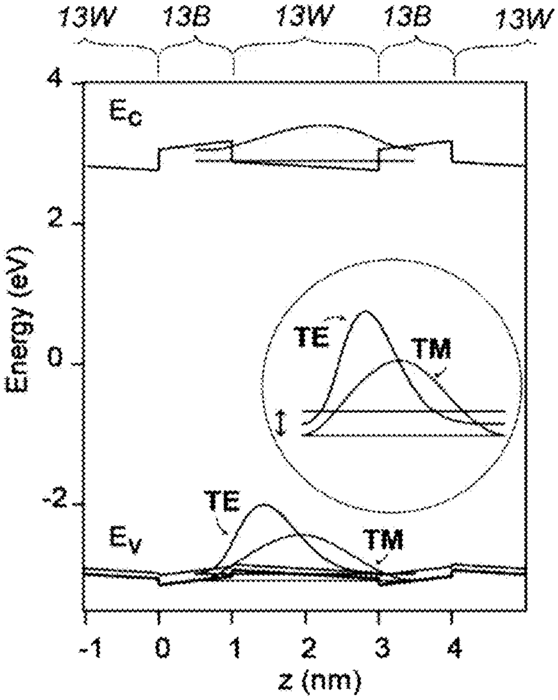

FIG. 10A and FIG. 10B are band diagrams to illustrate the technical concept of the present embodiment by contrasting a conventional LED (FIG. 10A) with the LED of the present embodiment (FIG. 10B), focusing on the polarization of the emitted UV light. The simulation software nextnano (nextnano GmbH, Munich, Germany) was employed to calculate the band diagram, and the Al compositions of the barrier and well layers used in the calculation were 0.94 and 0.82, respectively. These figures show an enlarged view of a portion of the 13 W quantum well layer, showing two band profiles near the conduction band edge (EC) and the valence band edge (EV) and the envelope of the wavefunction in terms of the magnitude of the amplitude at each position. An enlarged view of the two wavefunction envelopes near the pair of valence band edges is also shown within the circles in each FIG. FIG. 10A shows a structure with a 2 nm thick quantum well layer 13W and a 6 nm thick barrier layer 13B, and FIG. 10B shows a structure with a 2 nm thick quantum well layer 13W and a 1 nm thick barrier layer 13B, both under conditions of crystal growth on a polar substrate. The left and right directions of the drawings are in the thickness direction, but as shown in the scale, the scale in the thickness direction is enlarged in FIG. 10B than in FIG. 10A. The ranges of the quantum well layer 13W and the barrier layer 13B are shown above the graphs in FIG. 10A and FIG. 10B. Specifically, for the conventional LED, the barrier layer 13B lies from the origin (0 nm) to 6 nm and from 8 nm to 14 nm in the thickness direction, while the quantum well layer 13W lies from −2 nm to 0 nm, from 6 nm to 8 nm, and from 14 nm to 16 nm in the thickness direction. In contrast, for the LED, the barrier layer 13B lies from −2 nm to 0 nm, from 6 nm to 8 nm, and from 14 nm to 16 nm in the thickness direction. In contrast, in the present embodiment, where the barrier layer is 1 nm thick, the barrier layer 13B lies from the origin (0 nm) to 1 nm and from 3 nm to 4 nm, and the quantum well layer 13W lies from 1 nm to 3 nm and from 4 nm to 6 nm.

The thickness of the barrier layer of 6 nm has been commonly used in the structure of conventional LEDs with an emission wavelength of about 280 nm. As mentioned above, TE emission is easily extracted from the LED itself as it is emitted in the direction of the thickness of the stacked structure of the LED in FIG. 1, while TM emission is not easily emitted as it is emitted toward the in-plane direction of the stacked structure.

As shown in FIG. 1, in the structure of the LED 100A of the present embodiment, a plurality of quantum well layers 13W are provided and the adjacent quantum well layers 13W are separated by a barrier layer 13B. In the conduction band edge $E_C$ profiles in FIGS. 10A and 10B, the quantum well layer 13W and barrier layer 13B are depicted at the conduction band edge $E_C$ at low and high energies, respectively. The two profiles near the valence band edge $E_V$ are the opposite. This FIG is obtained by a coupled calculation of the Schrödinger and Poisson equations for a structure with periodically repeating well and barrier layers. The two band profiles near the conduction band edge and the valence band edge each have a slope corresponding to a crystal formed on a polar substrate.

In general, the lower energy conduction band edge of the quantum well layer 13W is located below the higher energy conduction band edge of the adjacent barrier layer 13B, which, when traced in the thickness direction, has a convex shape downward and acts as a quantum well. The electrons that contribute to emission undergo an optical transition from the state formed in that quantum well. The optical transition of electrons is a recombination in pairs with states at the valence band edge (hole states) that satisfy the selection rule based on spatial symmetry. In this case, in addition to the selection rule based on spatial symmetry, the optical transition with holes with the smallest energy difference is dominant, and photons with that energy difference are emitted. The radiation pattern depends on the direction of the electric dipole moment of the optical transition, and the direction in which the optical transition of the electric dipole moment occurs is determined by the pair of wave functions that provides the pair of starting and ending states allowed by the selection rule reflecting spatial symmetry. The two states near the valence band edge in FIGS. 10A and 10B are marked with the sign TE for the envelope of probability of finding electrons in the state where TE emission is dominant in the optical transitions between the quantum well layer states, and TM for those where TM emission is dominant.

Generally aligned with the quantum well layer 13W near the conduction band edge and valence band edge in FIGS. 10A and 10B, one wave function envelope is marked at the conduction band edge and two at the valence band edge. The number of these envelopes corresponds to the number of profiles at the conduction band edge and the valence band edge, respectively. The vertical position of the straight lines drawn for the reference of the amplitudes of the envelopes is depicted in the drawings in correspondence with the energy values of the scale for the band profiles shown on the left axis of each FIG, except for those in the enlarged figures. The inventors investigated the band structure in detail by theoretical calculations using the simulation software next-nano and found that in the case of the 6 nm barrier layer shown in FIG. 10A, the wave function of the electrons, which is TM polarized, gives high energy at the valence band edge. In other words, the quantum well layer 13W is sufficiently thin with a thickness of 2 nm, but when the Al composition ratio is adjusted for an emission wavelength of about 210-230 nm, the TM emission becomes dominant if the thickness of the barrier layer 13B remains the conventional 6 nm. This was revealed to be one of the reasons for the low emission efficiency. Note that TE emission is performed in LEDs designed by conventional methods, such as blue light emitting diodes, which employ GaN-based materials (including InGaN-based materials) with an Al composition ratio of 0. In LEDs designed using the conventional method, the relative ratio of TM emission increases as the Al composition ratio increases for shorter wavelengths by adopting AlGaN-based crystals, and TE and TM emission become comparable for materials with an Al composition ratio of approximately 0.5. If the Al composition ratio is continued increasing, almost 100% of the emission will eventually be TM emission. Conventional deep-ultraviolet LEDs operating at 260-280 nm with Al composition ratios exceeding 0.5, for example, use a thin quantum well layer of about 2 nm to increase the relative ratio of TE emission by confinement of the quantum effect. However, the quantum confinement effect of a thin quantum well layer cannot induce an inversion of the energy value of the hole state. In other words, if a high Al composition ratio is adopted for the emission wavelength of 210-230 nm, it is difficult to avoid the high ratio of TM emission as shown in FIG. 10A by simply using the conventional LED design method and a thin quantum well layer, and no improvement in efficiency can be expected. Even if the quantum well layer is made thinner, there is concern about the adverse effects of carriers leaving the quantum well layer.

Figure 11:
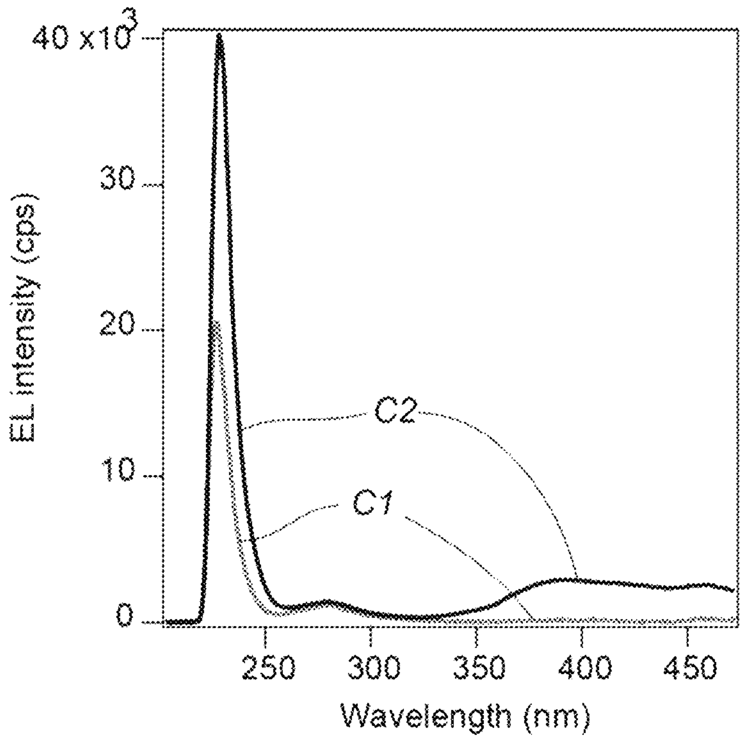
FIG. 11 is a graph showing the measured emission spectra of samples of conventional LEDs and LEDs of an embodiment of the present disclosure.
Figure 12:
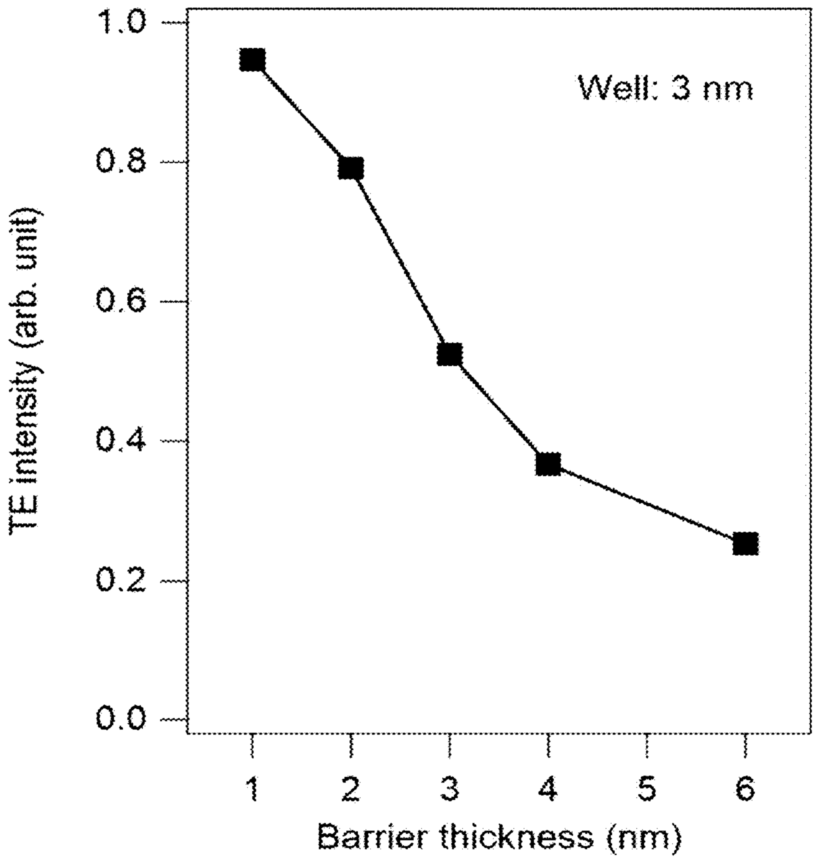
FIG. 12 is a graph showing the relationship between the thickness of the barrier layer and the intensity of TE emission, obtained in a simulation to confirm the technical concept of an embodiment of the present disclosure.

To address this issue, the inventors found that, even with a high Al composition ratio for 210-230 nm in the present embodiment, if the barrier layer 13B is made thinner as shown in FIG. 10B, the electron wave function can be performed such that the TE emission is the one with the smaller energy difference from the conduction band edge among the two wave functions at the valence band edge, and TE emission can be generated dominantly. FIG. 11 is a graph showing the measured emission spectra of LED samples fabricated with the barrier layer thickness of 6 nm (curve C1) and 1 nm (curve C2) to confirm the technical concept of the present embodiment. The operating conditions were room temperature (300 K) and 50 mA (device size 0.16 $mm^2$). The LED samples were compared here with LED samples in which the composition-graded spacer layer 136A was employed, the quantum well layer 13W was fixed at 2 nm thickness, and the barrier layers 13B were 6 nm and 1 nm. Both emission wavelengths are 227 nm and the number of quantum well layers 13W is 4. FIG. 12 is a graph showing the relationship between the thickness of the barrier layer 13B and the intensity of TE emission, with the thickness of the quantum well layer fixed to 3 nm and the number thereof fixed to 4, obtained in a simulation to confirm the technical concept of the present embodiment. As shown in FIG. 11, by changing the barrier layer 13B from the conventional 6 nm to 1 nm, the emission intensity is generally enhanced by a factor of 2. Also, as can be seen in FIG. 12, the emission intensity begins to increase significantly when the barrier layer 13B is reduced to a thickness of 4 nm or less, compared to a barrier layer 13B thickness of 6 nm. A barrier layer 13B thickness of 4 nm or less is preferred, 3 nm or less is even more preferred, 2 nm or less is even more preferred, and 1 nm or less is even more preferred. The thickness of the barrier layer 13B has no particular manufacturing problems if it is thicker than 0.25 nm, which is the thickness of a monolayer. The thickness of the barrier layer 13B can also be determined based on the thickness of the quantum well layer. To be specific, setting the thickness of the barrier layer 13B so that it is less than or equal to the thickness of the quantum well layer is a preferred structure. Furthermore, it is also useful to determine the thickness based on the relative ratio of TE and TM emission. When the thickness of barrier layer 13B is 3 nm to 4 nm or less, TE emission exceeds TM emission by about 50% of the intensity of total emission (TE emission+TM emission). Therefore, the thickness of barrier layer 13B should also be determined so that TE emission is stronger than TM emission. However, the ratio of TE emission exceeds 90% when the thickness of the barrier layer 13B is about 1 nm. Even if the thickness of the barrier layer 13B is further reduced to 0.5 nm (the equivalent of two monolayers), the TE emission ratio is not much different from that of the 1 nm case. Therefore, high practicality can be expected by determining the lower limit of the thickness of the barrier layer 13B to be 1 nm or less, which is easy to stably manufacture. Considering the possibility of distortion in the crystals that structure the emitting layer 134 and barrier layer 13B, there may be a situation in which the thickness of the barrier layer 13B is less than 0.25 nm, for example, 0.2 nm, in the implemented UV light emitting diode. In other words, the preferred thickness of the barrier layer 13B for a monolayer is 0.2 nm or more. The thinning of the barrier layer 13B in addition to the quantum well layer 13W can generate TE emission and also maintain carrier capture, so that there is no concern about efficiency loss due to carrier desorption. Furthermore, although there is a concern that carrier mobility will generally decrease at high Al composition ratios, making the barrier layer 13B thinner is also advantageous in that the carrier distribution among the multiple quantum well layers 13W is more uniform. When the thickness of the barrier layer 13B is 6 nm, the TE emission ratio is about 20%.

The inventors believe that the reason why TE emission increases with a thinner barrier layer 13B is as follows. As mentioned above, the optical transitions that cause emission are those in which the electrons are at the conduction band edge as the initial state and the electrons are at the valence band edge as the final state. The direction of the electric dipole moment that is realized by the value of the large dipole matrix element between the initial state and the final state determines whether the emission is TM or TE emission. There is one electronic state on the conduction band edge that is the initial state, whether the barrier layer 13B is thinned or not, and there can be two states on the valence band edge (hole states) that can act as the final state. In other words, the state that contributes to emission in a quantum well must have an energy less than the maximum energy of the barrier layer, and this state is generally the bound state. States with energies greater than the maximum energy are unbound states. The number of bound states depends on the size of the effective mass and the size of the confinement potential (energy difference between the barrier layer and the well layer), and the lighter the effective mass and the smaller the confinement potential, the smaller the number of bound states. In Far-UVC LEDs, the confinement potential cannot be too large to achieve short wavelengths. Therefore, in this calculation, there is only one bound state for electrons. This situation should be contrasted with the case of LEDs emitting light at 280 nm, where more than one binding state for electrons is possible. On the other hand, the number of bound states for holes is quite large, about 10 in the present calculation. However, the contribution to emission depends on the distribution of carriers in the bound states. Since the number of carriers decreases exponentially with deeper (lower in the band diagram) bound states, the emission characteristics is mostly determined by comparing the shallowest bound state with the second shallowest bound state. FIGS. 10A and 10B show only two levels in this sense. Note that the TE/TM emission intensity ratio in FIG. 12 is calculated by considering up to the fourth bound state, but the number of carriers in the fourth state is less than 1% of the first. This is shown in FIGS. 10A and 10B. If we consider a change such that the barrier layer 13B becomes thinner and thinner, the valence band edge state will try to shift toward the lower energy side (lower in FIG. 10A and FIG. 10B) due to the quantum confinement effect, in other words, in the direction where the energy difference between the conduction band edge state and the valence band edge state widens. The amount of this shift is due to quantum confinement and is more fundamentally a consequence of the uncertainty principle. The electron has a smaller effective mass in the two states in question at the valence band edge, the one responsible for TM emission than the one responsible for TE emission. Therefore, the state responsible for TM emission, where the effective mass of the electron is smaller, is shifted significantly downward. In contrast, the state responsible for TE emission, which has a large effective mass, has a relatively small shift. As a result of making the barrier layer 13B thin, the state responsible for TM emission, which has a small effective mass, can be shifted significantly downward and can also go past the state responsible for TE emission. This is probably the reason for the change from TM emission to TE emission between FIGS. 10A and 10B. Conventionally, the quantum confinement effect by thinning the quantum well layer 13W has been considered, but in the present embodiment, it was found for the first time that the shift can be generated even by thinning the barrier layer 13B, and it was confirmed experimentally that the shift is effective for optical transitions at wavelengths below 240 nm. The shift is also effective for optical transitions at wavelengths below 240 nm.

One of the reasons why the barrier layer 13B contributes to the quantum confinement effect may be related to the valence band edge profile, which is saw-blade shaped due to tilting and bending in the quantum well and barrier. Such a valence band edge profile reflects the fact that the crystal has a polar orientation. However, the quantum well layer 13W and the thinned barrier layer 13B affect the valence band edge profile, resulting in the shift described above. The effect of thinning the barrier layer 13B as a single layer is not limited to cases where the crystal has a polar orientation but can be effective even when the substrate for epitaxial growth is not a polar substrate but a semi-polar or non-polar substrate.

1-4. Combination of Composition-Graded Spacer Layer and Thinner Barrier Layer

Figure 13A:
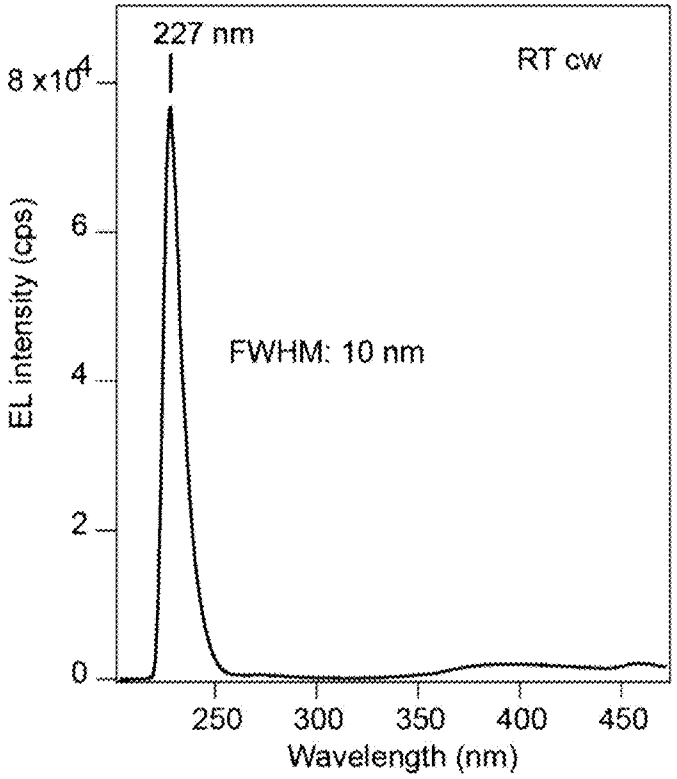
FIGS. 13A and 13B are graphs of the emission spectrum (FIG. 13A) and current light output characteristics (FIG. 13B) of the LED sample in an embodiment of the present disclosure.
Figure 13B:
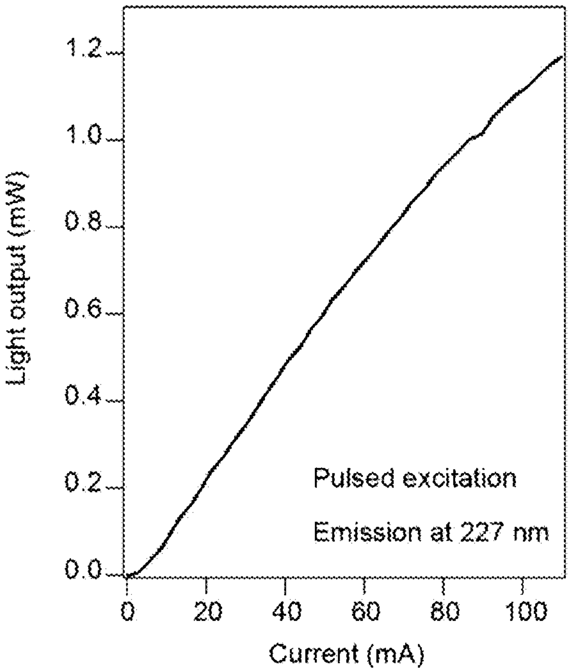

In the LED sample exhibiting the emission spectrum shown by curve C2 in FIG. 11, the difference in the thickness of the barrier layer 13B was verified after employing the spacer layer 136A of composition gradient. As mentioned above in connection with FIG. 8A, the efficiency of electron injection is improved in the spacer layer 136A with composition gradient. In other words, the spacer layer 136A of composition gradient and the thinner barrier layer 13, both of which are related to emission operation, do not create any technical obstacles for their combination. Therefore, it is advantageous from the standpoint of practicality to employ these technical concepts concurrently. FIG. 13A and FIG. 13B are graphs of the emission spectrum (FIG. 13A) and current light output characteristics (FIG. 13B) in the Far-UVCLED sample of the present embodiment, in which the composition-graded spacer layer and the thinned barrier layer are applied at the same time as in FIG. 8A. As shown in FIG. 13A, a narrow single peak emission with an emission wavelength of 227 nm and a full width at half maximum of 10 nm was observed in the Far-UVC region during continuous operation at room temperature. Furthermore, as shown in FIG. 13B, it was confirmed that a Far-UVC LED with an external quantum efficiency of 0.2% and an optical output of 1.2 mW in pulsed operation, which is a practical level, can be practiced.

1-5. Variations

The technical concepts in the present embodiment, such as composition-graded spacer layers and thin barrier layers for TE emission enhancement, are equally applicable not only to AlGaN-based crystals, but also to structures with InAlGaN-based crystals, for example, where In is also included as part of the composition of any of the layers. These technical concepts are also applicable to LEDs whose emission wavelength range is outside the 210-230 nm range. Furthermore, the LED manufacturing method that can be employed as the present embodiment is not particularly limited, and for example, in addition to the MOVPE method, the MBE (Molecular Beam Epitaxy) method can be employed. Although the composition distribution of the Al composition ratio in the spacer layer 136 is described for a structure in which the composition distribution is linearly increased or linearly decreased, various changes according to the position in the thickness direction of the stacking can also be employed as a variation of this embodiment.

In the above description, the embodiment of the present disclosure has been described specifically. Any description in the above is for the purpose of explaining the present disclosure, therefore the scope of the disclosure of this disclosure should be determined based on the recitation of the claims. In addition, other variations based on any combination of the embodiment are included in the present disclosure, which variation should also be within a scope of the claims.

INDUSTRIAL APPLICABILITY

The Far-UVCLED with an improved emission efficiency of the present disclosure is used in any devices that utilize it as a UV source.

REFERENCE SIGNS LIST

| | |
|---|---|
| 100, 100a | light emitting diode (Far-UVCLED) |
| 102 | light extraction side |
| 104 | one side of substrate |
| 110 | substrate |
| 120 | buffer layer |
| 132 | n-type conductive layer |
| 134 | emitting layer |
| 13w | quantum well layer |
| 13b | barrier layer |
| 136 | spacer layer |
| 136a | (composition-graded) spacer layer |
| 138 | electron blocking layer |
| 140 | first electrode |
| 150 | p-type contact layer |
| 160 | reflective electrode |
| 162 | insert metal layer |
| 164 | UV reflective film |

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An ultraviolet light emitting diode having a crystal that includes aluminum, gallium, and nitrogen, comprising:

an emitting layer;

a spacer layer; and an electron blocking layer, wherein the emitting layer, the spacer layer, and the electron blocking layer are stacked in this listed order from upstream to downstream of an electron flow, wherein an Al composition ratio in the spacer layer varies along a position of a thickness direction of the layers, wherein the Al composition distribution of the spacer layer has a slope such that the Al composition ratio decreases from the emitting layer to the electron blocking layer, and wherein a value of a final Al composition ratio is determined in accordance with a peak emission wavelength at an interface quantum well, the final Al composition ratio being the Al composition ratio at a position touching the electron blocking layer, and the interface quantum well being formed by an interface between the spacer layer and the electron blocking layer.

2. The ultraviolet light emitting diode according to claim 1, wherein the emitting layer has at least one barrier layer and at least two quantum well layers sandwiching the barrier layer, and wherein the barrier layer is configured as a thinned layer.

3. The ultraviolet light emitting diode according to claim 1, wherein a composition distribution of the spacer layer has a slope such that the Al composition ratio increases from the emitting layer to the electron blocking layer.

4. The ultraviolet light emitting diode according to claim 1, wherein a principal wavelength of an ultraviolet light emission is between 210 and 230 nm inclusive.

5. An electrical apparatus comprising the ultraviolet light emitting diode according to claim 1 as an emitting source of ultraviolet light.

* * * * *